(12) United States Patent
Popplewell et al.

(10) Patent No.: US 6,304,071 B1
(45) Date of Patent: *Oct. 16, 2001

(54) PHASE DETECTOR THAT SAMPLES A READ SIGNAL AT SAMPLING POINTS AND DELAY

(75) Inventors: Andrew Popplewell; Stephen Williams, both of Manchester (GB)

(73) Assignee: NeoMagic Corp., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/226,440

(22) Filed: Jan. 6, 1999

(30) Foreign Application Priority Data

Jan. 9, 1998 (GB) .................................... 9800353

(51) Int. Cl.[7] ....................................................... G01R 13/34
(52) U.S. Cl. ............................................................ 324/76.58
(58) Field of Search ........................... 324/76.58, 76.62, 324/76.23, 76.15, 76.52, 76.53

(56) References Cited

U.S. PATENT DOCUMENTS 4,620,147 * 10/1986 Niki .................................. 324/76.15
5,038,096 * 8/1991 Obie et al. ........................ 324/76.23
5,990,673 * 11/1999 Forsberg ........................... 324/76.62

* cited by examiner

*Primary Examiner*—Safet Metjahic
*Assistant Examiner*—J Kerveros

(57) ABSTRACT

A phase detector determines a phase error value dependent on the relative phase between a local oscillator signal, used for the system clock, and an input signal received over a PR (a, b, b, a) channel. The error value is used to lock the phase and frequency of an input signal to the phase and frequency of the clock in a phase-lock loop (FIG. 1, not shown). The input signal is sampled at regular intervals in accordance with the local oscillator signal, and the sampled values provided on a line 10. A threshold slicer 22 selects an ideal sample value for a sampling point by comparing the sampled values with thresholds received on threshold inputs 23 to 26. A subtracter 32 determines a difference value which corresponds to a difference between the ideal sample value and the actual sample value for that sampling point. A subtracter 28 and a delay register 29 operate to determine the sense of change to the ideal sample value from a ideal sample value for a preceding sampling point. A second subtracter 42 and a second delay register 31 determine the sense of change to the ideal sample value for a preceding sampling point from a ideal sample value for a twice preceding sampling point. The phase error value provided is dependent on the senses of change detected and on the difference value.

20 Claims, 2 Drawing Sheets

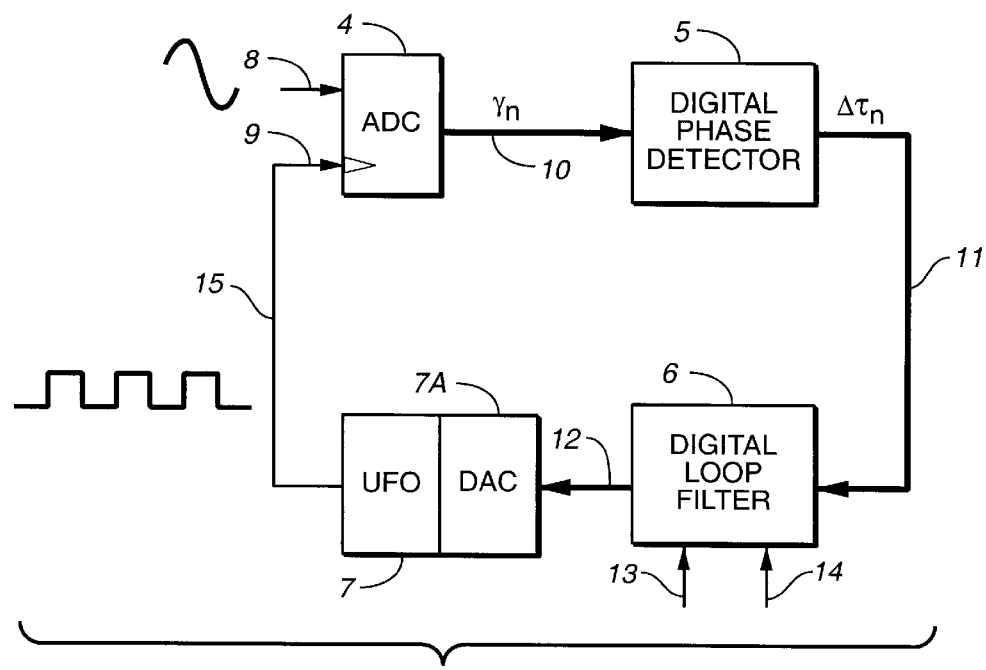
FIG._1
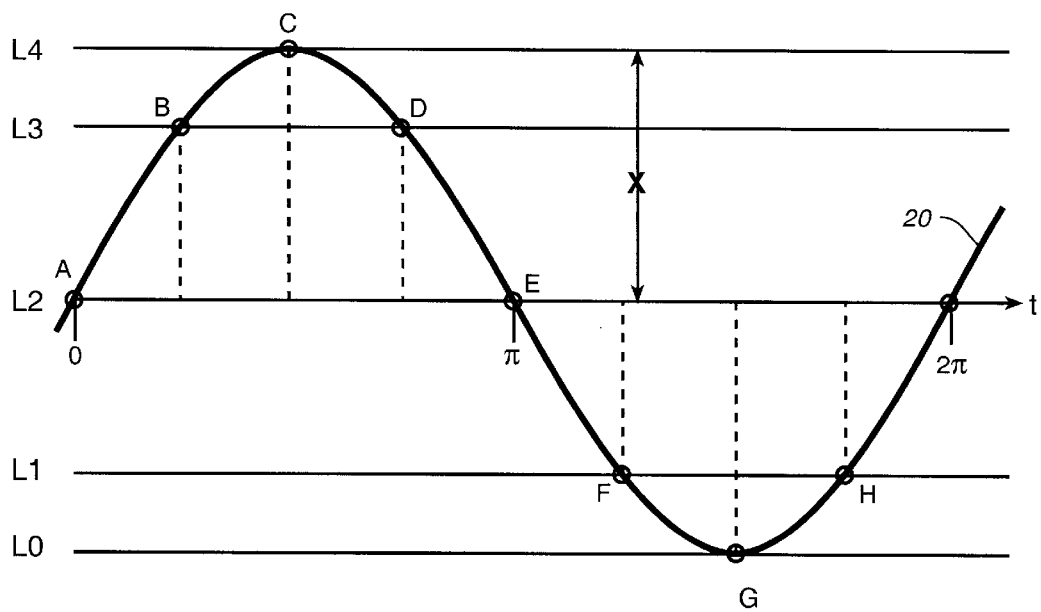
FIG._2

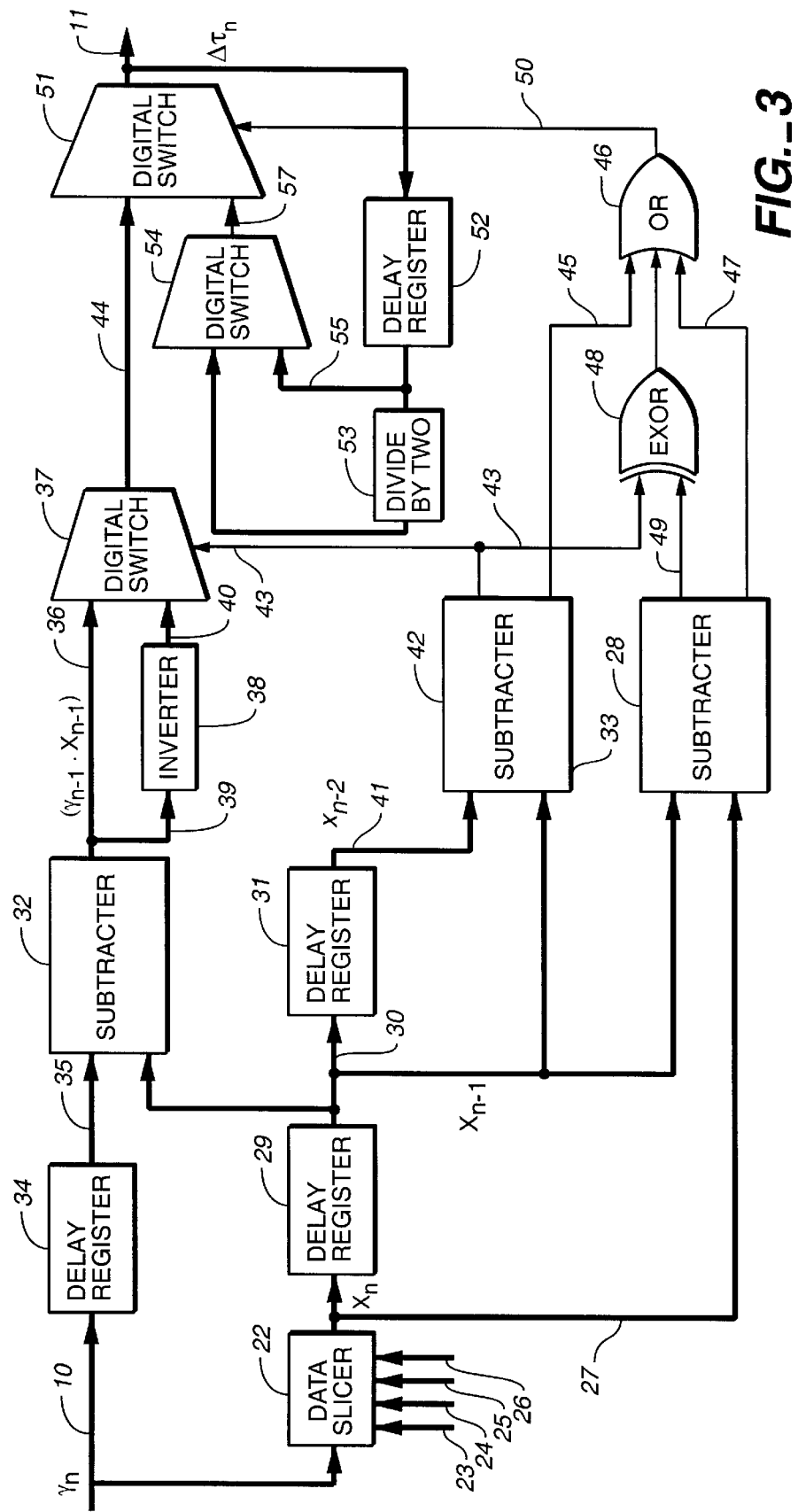

PHASE DETECTOR THAT SAMPLES A READ SIGNAL AT SAMPLING POINTS AND DELAY

FIELD OF THE INVENTION

The present invention relates to phase detectors and more particularly to phase detectors for determining an error value dependent on the relative phase between a local oscillator signal and an input signal received over a channel having a class of partial response denoted as PR(a, b, b, a).

BACKGROUND OF THE INVENTION

To recover data from noisy channels, such as for example magnetic data carriers having high data densities, it is known to class the write/read channel of the data carrier in accordance with a partial response characteristic which approximates to the frequency response characteristics of the channel, and the arrangement or design of a digital data recovery circuit is selected to optimise data recovery from a channel with that partial response characteristic. As the correct recovery of data is so dependent on how well the channel characteristics are matched by the form of data recovery circuit selected, it is common to provide an equaliser circuit on the input of the data recovery circuit to compensate for any difference between the actual and the approximated channel characteristics.

The data recovery circuit contains a phase-lock loop circuit arrangement which receives an analogue read signal, from the equaliser circuit if there is one, and operates to control an oscillator at the phase and an integer multiple frequency of components of interest of the incoming data stream. Signals generated by this oscillator are used to sample the incoming analogue signal at appropriate sampling points, from which samples data recovery is performed. Correct phase alignment of the oscillator signals and the components of interest of the analogue read signal are critical in performing correct data recovery.

To assist the phase lock loop circuit arrangement in achieving fast initial frequency and phase alignment, the data carrier will usually have one or more regions in which VFO field data has been intentionally written. The VFO field data is a regular data pattern which, when being read, provides an analogue signal which in approximately sinusoidal and periodic in nature. In using these data channels, it is known for the data to be encoded to contain a minimum of two consecutive like bits in the data stream, and the VFO field data may for example comprise a succession of pairs of like data bits.

It is widely appreciated that certain types of optical data carrier channels currently being investigated for development will have a response characteristic approximating that of equation (1).

$$F(D)=a+bD+bD^2+aD^3 \qquad \text{Eqn. (1)}$$

Here, a and b are constant coefficients and D is a unit delay operator. This type of channel can be referred to as a class of partial response PR(a, b, b, a) channel.

SUMMARY OF THE INVENTION

In accordance with a first aspect of the present invention, a phase detector, for determining an error value dependent on the relative phase between a local oscillator signal and an input signal received over a PR (a, b, b, a) channel, which received signal is sampled at regular intervals, which intervals are dependent upon the local oscillator signal, comprises:

means to select an ideal sample value for a sampling point;

means to determine a difference value corresponding to a difference between the ideal sample value and the actual sample value for that sampling point;

means to determine the sense of change to the ideal sample value from a ideal sample value for a preceding sampling point;

a means to determine the sense of change to the ideal sample value for a preceding sampling point from a ideal sample value for a twice preceding sampling point; and a means responsive to at least one of said senses of change so determined and to said difference value to provide said error value.

The sign of the difference value may be operated on in dependence on at least one of the senses of change so determined. Alternatively or in addition, the difference between the ideal sample value and the actual sample value for the preceding sampling point may be used to provide said error value.

The difference value may be provided as the error value only at a sample time when both of said senses of change are determined to be the same and each non-zero. Here, the phase detector may further comprise a means responsive when said senses of change are different or at least one of said senses of change is zero to provide a preceding error value as the error value. In this case, the phase detector may further comprise a means responsive when in a track mode and when said senses of change are different or at least one of said senses of change is zero to provide a predetermined fraction of a preceding error value as the error value. Said predetermined fraction may be one half.

Preferably, the magnitude of the error value is equal to the magnitude of the difference value.

In accordance with a second aspect of the present invention, a method, for determining an error value dependent on the relative phase between a local oscillator signal and an input signal received over a PR(a, b, b, a) channel, which signal is sampled at regular intervals which are dependent upon the local oscillator signal, comprises:

selecting an ideal sample value for a sampling point;

determining a difference value corresponding to a difference between the ideal sample value and the actual sample value for a sampling point;

determining the sense of change to the ideal sample value from a ideal sample value for a preceding sampling point;

determining the sense of change to the ideal sample value for a preceding sampling point from a ideal sample value for a twice preceding sampling point; and providing said error value dependent on said difference value and at least one of said senses of change so determined.

Here, the sign of the difference value may be operated on in dependence on at least one of the senses of change so determined. In either case, the difference between the ideal sample value and the actual sample value at the preceding sampling point may be used to provide said error value.

Advantageously, the difference value is provided as the error value only when both of said senses of change are determined to be the same and each non-zero for a sampling point. Here, the method may further comprise providing a preceding error value as the error value when said senses of change are different or at least one of said senses of change is zero. In this case, the method may still further comprise providing a predetermined fraction of a preceding error value as the error value when in a track mode and when said senses of change are different or at least one of said senses of change is zero. Said predetermined fraction may be one half.

In accordance with a third aspect of the present invention, a phase-locked loop incorporates any of the above phase detectors.

BRIEF DESCRIPTION OF THE DRAWINGS

An embodiment of the present invention will now be described with reference to the accompanying drawings of which;

FIG. 1 shows a digital phase-lock loop incorporating a phase detector in accordance with the present invention;

FIG. 2 shows an analogue VFO field data read signal and ideal sampling points thereof; and FIG. 3 shows the phase detector of FIG. 1.

DESCRIPTION OF THE PREFERRED EMBODIMENT

Referring to FIG. 1, the digital phase lock loop comprises a flash analogue to digital convertor (ADC) 4, a digital phase detector 5, a digital loop filter 6 and a variable frequency oscillator (VFO) 7.

The ADC 4 receives an analogue read signal on an input terminal 8 and provides a digital value $Y_n$, representative of the amplitude of the read signal at the rising edge of a clock signal received on a clock input terminal 9, to the phase detector 5 on a first digital line 10. The phase detector provides a phase error value $\Delta\tau_n$, representative of a calculated difference between the actual phase of the clock signal and a desired phase, to the digital loop filter 6 on a second digital line 11. The digital filter 6 operates on the phase error value $\Delta\tau_n$ to provide a filtered phase error value to a digital to analogue converter 7A on the input of the VFO 7 on a third digital line 12. The frequency response of the filter 6 may be varied by application of different filter coefficients to coefficient input terminals 13 and 14. The VFO 7 provides a limited signal, having a phase and a frequency dependent on the signal received on the third digital line 12, on a clock line 15 to the clock input terminal 9 of the ADC 4.

Referring now to FIG. 2, the VFO field data read signal 20 is shown having an approximately sinusoidal shape of amplitude X Volts and period $2\pi t$ seconds. First to eighth ideal sampling points A to H correspond to quarters of $\pi t$ from 0 to $7\pi/4$ as shown, thus forming eight sampling points at regular intervals in the period of the signal 20.

When phase-locking and frequency-locking to the VFO field data read signal, the phase detector 5 of the present invention is set into an "acquisition" mode, in which the phase detector 5 performs the computations of Equations (2) and (3) to determine the sense of change of the amplitude of the input signal to the amplitude of the input signal at the sampling times t=n and t=n−1 respectively.

$$\text{grad1}=\text{sign}\ (X_n-X_{n-1}) \quad \text{Eqn (2)}$$

$$\text{grad2}=\text{sign}\ (X_{n-1}-X_{n-2}) \quad \text{Eqn (3)}$$

where: $X_n$ is an ideal sample value at a time t=n;

$X_{n-1}$ is an ideal sample value at the preceding sample time, t=n−1; and $X_{n-2}$ is the ideal sample value at the twice preceding sample time, t=n−2.

Following this computation, grad1 is +1 if $X_n>X_{n-1}$; −1 if $X_n<X_{n-1}$ and 0 if $X_n=X_{n-1}$.

Grad2 is similarly derived.

From the results of the computations of equations (2) and (3), a value for grad is derived from the calculation shown in equation (4).

$$grad = \begin{matrix} grad1 & \text{if } grad1 = grad2 \\ 0 & \text{otherwise} \end{matrix} \quad \text{Eqn. (4)}$$

When grad is not equal to zero, the computation of equation (5) is performed.

$$\Delta\tau_n=\text{grad}(Y_{n-1}-X_{n-1}) \quad \text{Eqn (5)}$$

where: $\Delta\tau_n$ is a phase error value at time t=n, $Y_{n-1}$ is a sample value at time t=n−1, and $X_{n-1}$ is the ideal sample value at time t=n−1.

When grad is equal to zero, the phase detector 5 determines the phase error value as in Equation (6).

$$\Delta\tau_n=\Delta\tau_{n-1} \quad \text{Eqn. (6)}$$

The result of these calculations is that for all sample points where the gradient of the read signal 20 is the same for two successive sample intervals, i.e. sample points A, B, C, E, F and G, the phase error value is proportional to the difference between the actual sample value and the ideal sample value at time t=n−1. It will be noted that a new phase error value $\Delta\tau_n$ is thus calculated six times in the period of the VFO field data read signal 20.

The phase detector 5 is shown in detail in FIG. 3, in which the first digital line 10 and the second digital line 11 are six bit digital lines, thus allowing each of $Y_n$ and $\Delta\tau_n$ to assume a decimal value in the range of −32 to +31.

The value of $Y_n$ on the digital line 10 is examined by a data slicer 22, which then determines the ideal sample value. This determination is made by digitally comparing $Y_n$ to four thresholds provided on respective ones of slicer threshold inputs 23, 24, 25 and 26. The threshold provided on the input 23 corresponds to the mean value of L0 and L1, the threshold on the input 24 corresponds to the mean value of L1 and L2, the threshold provided on the input 25 corresponds to the mean value of L2 and L3, and the threshold provided on the input 26 corresponds to the mean value of L3 and L4. By examining which of the thresholds are exceeded by $Y_n$, the data slicer 22 determines which of the levels L0, L1, L2, L3 and L4 $Y_n$ is most similar to in value, and provides the value so determined on a further digital line 27 as $X_n$.

Alternatively, the data slicer 22 may use knowledge of the value of $Y_n$ received on preceding clock cycles to estimate where in the period of the read signal 20 the present sample value relates to, and determine $X_n$ using extrapolation of preceding values of $Y_n$ and examination of the current value of $Y_n$. This alternative may provide a phase detector 5 which is less likely to determine an incorrect value of $X_n$ in the face of a noisy read signal 20.

The digital line 27 carries the value of $X_n$ provided by the data slicer 22 to a subtracter device 28 and to a delay register 29. The delay register 29 provides the value provided by the data slicer 22 on the preceding clock cycle, i.e. $X_{n-1}$, on a further digital line 30 to a further delay register 31, to a second subtracter 32 and to a third subtracter 33.

The subtracter device 32 digitally subtracts $X_{n-1}$, received on the line 30, from $Y_{n-1}$, derived from $X_n$ on the line 10 by a further delay register 34 and provided thereby on a further digital line 35, and provides a difference value $Y_{n-1}-X_{n-1}$ corresponding to the difference between these values on a further digital line 36. A digital switch 37 receives both the difference value from the subtracter device 32 and the inverse of the difference value from an inverter device 38. The inverter device 38, in effect, inverts the sign of the value of $Y_{n-1}-X_{n-1}$ on a branch 39 of the line 36 and provides the result to the digital switch 37 on a line 40.

The delay register 31 provides on a further digital line 41 the value of $X_n$ on the twice preceding clock cycle, i.e. $X_{n-2}$, which is then subtracted from the value of $X_{n-1}$ by a further subtracter 42. The sign of the result of this subtraction, which is the calculation of Equation (3), is thus representative of the sense of change to the preceding ideal sample value from the twice preceding sample value. This sign, when positive, is provided as a logical 1 signal on an output line 43 to a switch control input of the digital switch 37 and to an input of an EXOR gate 48. Thus, a positive result from the Equation (3) calculation causes the $Y_{n-1}-X_{n-1}$ value from the line 36 to be provided on a further digital line 44, and a negative result from the Equation (3) calculation causes the inverse value from the line 40 to be provided on the line 44. The switch 37 thus performs the calculation of Equation (5), operating on the difference value in dependence on the sense of change to the preceding ideal sample value from the twice preceding sample value. Where the subtraction of $X_{n-2}$ from $X_{n-1}$ results in zero, i.e. there is no sign, a logical 1 signal is provided on an output line 45 to an input of an OR gate 46.

The subtracter 28, functionally similarly to the subtracter 42, provides a logical 1 signal on an output line 47 to an input of the OR gate 46 if the subtraction of $X_{n-1}$ from $X_n$ results in zero. The sign of the result of this subtraction, which is the result of the calculation of equation (2), is thus representative of the sense of change to the ideal sample value from the preceding ideal sample value. This sign, when positive, is provided as a logical 1 signal to an input of the EXOR gate 48 on a line 49, and is provided as a logical 0 signal on the line 49 otherwise.

The effect of the OR gate 46 and the EXOR gate 48, which has its output connected to a further input of the OR gate 46, is to provide a logical 1 signal on an output line 50 of the OR gate 46 when any of the following conditions are satisfied: the result of equation (2) is zero; the result of equation (3) is zero; or one but not the other of equations (2) and (3) has a positive result. The arrangement 46, 48 thus determines when both of the senses of change are the same and are non-zero.

The output line 50 of the OR gate 46 is connected to the switch control input of a further digital switch 51. The value on the digital line 44, which is the result of the Equation (5) calculation, is passed as $\Delta\tau_n$ onto the output digital line 11 of the switch 51 when a logical 0 signal is present on the line 50. When the signal provided by the OR gate 46 on the line 50 a logical 1, the switch 51 is caused to pass as $\Delta\tau_n$ onto the line 11 a value provided by a feedback circuit comprising a further delay register 52, a divide by two device 53 and a further digital switch 54. The delay register 52 receives the value of $\Delta\tau_n$ from the digital line 11 and provides the value of $\Delta\tau_n$ on the preceding clock cycle; i.e. $\Delta\tau_{n-1}$, on a further digital line 55 to both of an input of the switch 54 and an input of the divide by two device 53. The divide by two device 53 provides one half of the $\Delta\tau_n$ value to a second input of the switch 54 on a further digital line 56.

Whether the switch 54 passes the value from the divide by two device 53 or the value from the delay register 52 to the second input of the switch 51 on a further digital line 57 depends on the logic signal applied to the control switch input of the switch 54. Preferably a mode device (not shown) provides a logical 1 signal to the switch control input of the switch 54, thereby providing the output value of the delay register 52 to the switch 51, when the phase-lock loop of FIG. 1 is in acquisition mode, and provides a logical 0 signal to the switch control input of the switch 54 when in a track mode.

In this way, because the value of $\Delta\tau_n$ is held from the preceding clock cycle when either of equations (2) and (3) result in zero or one but not the other has a positive result, rapid lock can be achieved when reading VFO field data. When in a track mode, the holding of the value of $\Delta\tau_n$ from the preceding clock cycle could cause the phase-lock loop to become unlocked when the read signal contains a significant number of consecutive like bits. To avoid this situation, the mode device (not shown) switches the digital switch 51 to receive values from the divide by two device 53. In this way, the "valid" value of $\Delta\tau_n$, i.e. the previous term calculated from a sample value where the OR gate 46 provided a logical 0 output signal, is successively divided by two for every sample time instance, until the value of $\Delta\tau_n$ eventually dwindles to zero, or a "valid" value of $\Delta\tau_n$ occurs.

What is claimed is:

1. A phase detector, for determining an error value dependent on a relative phase between a local oscillator signal and a read signal, the phase detector comprising:

means for comparing a first, a second, and a third actual sample value of said read signal to a plurality of thresholds to provide a first, a second, and a third ideal sample value respectively, wherein said first, said second, and said third actual sample values are determined at a sampling time, a preceding sampling time, and a twice preceding sampling time respectively relative to said local oscillator signal;

means for delaying said second actual sample value, said second ideal sample value, and said third ideal sample value until said first sampling time;

means for calculating a difference value corresponding to a difference between said second ideal sample value and said second actual sample value means for calculating a first sense of change to said first ideal sample value from said second ideal sample value;

means for calculating a second sense of change to said second ideal sample value from said third ideal sample value;

means for calculating a gradient responsive to said first sense of change and said second sense of change; and means for calculating said error value responsive to said gradient and said difference value.

2. The phase detector in accordance with claim 1, in which a plus/minus sign of said difference value is responsive to at least one of said first and said second senses of change.

3. The phase detector in accordance with claim 1, in which said difference between said second ideal sample value and said second actual sample value is used to provide said error value.

4. The phase detector in accordance with claim 1, in which said difference value is provided as said error value when both of said first and said second senses of change are determined to be the same and each non-zero.

5. The phase detector in accordance with claim 4, further comprising a means responsive when said first and said second senses of change are different or at least one of said first and said second senses of change is zero to provide a predetermined fraction of a preceding error value as said error value.

6. The phase detector in accordance with claim 5, in which said predetermined fraction is one half.

7. The phase detector in accordance claim 1, in which a magnitude of said error value is equal to a magnitude of said difference value.

8. A phase-locked loop incorporating the phase detector in accordance with claim 1.

9. A method for determining an error value dependent on a relative phase between a local oscillator signal and read signal, the method comprising the steps of:

comparing a first, a second, and a third actual sample value of said read signal to a plurality of thresholds to provide a first, a second, and a third ideal sample value respectively, wherein said first, said second, and said third actual sample values are determined at a sampling time, a preceding sampling time, and a twice preceding sampling time respectively relative to said local oscillator signal;

delaying said second actual sample value, said second ideal sample value, and said third ideal sample value until said first sampling time;

calculating a difference value corresponding to a difference between said second ideal sample value and said second actual sample value calculating a first sense of change to said first ideal sample value from said second ideal sample value;

calculating a second sense of change to said second ideal sample value from said third ideal sample value;

calculating a gradient responsive to said first sense of change and said second sense of change; and calculating said error value responsive to said gradient and said difference value.

10. The method in accordance with claim 9, in which a plus/minus sign of said difference value is responsive to at least one of said first and said second senses of change.

11. The method in accordance with claim 9, in which said difference between said second ideal sample value and said second actual sample value is used to provide said error value.

12. The method in accordance with claim 9, in which said difference value is provided as said error value when both of said first and said second senses of change are determined to be the same and each non-zero.

13. The method in accordance with claim 12, further comprising the step of providing a preceding error value as said error value when said first and said second senses of change are different or at least one of said first and said second senses of change is zero.

14. The method in accordance with claim 12, further comprising the step of providing a predetermined fraction of a preceding error value as said error value when in a track mode and when said first and said second senses of change are different or at least one of said first and said second senses of change is zero.

15. The method in accordance with claim 14, in which said predetermined fraction is one half.

16. The method in accordance with claim 9 in which a magnitude of said error value is equal to a magnitude of said difference value.

17. A phase detector configured to determine an error value dependent on a relative phase between a local oscillator signal and a read signal, the phase detector comprising:

a data slicer configured to compare a first, a second, and a third actual sample value of said read signal to a plurality of thresholds to provide a first, a second, and a third ideal sample value respectively, wherein said first, said second, and said third actual sample values are determined at a sampling time, a preceding sampling time, and a twice preceding sampling time respectively relative to said local oscillator signal;

a plurality of registers configured to delay said second actual sample value, said second ideal sample value, and said third ideal sample value until said first sampling time;

a plurality of subtracters configured to calculate (i) a difference value corresponding to a difference between said second ideal sample value and said second actual sample value, (ii) a first sense of change to said first ideal sample value from said second ideal sample value, and (iii) a second sense of change to said second ideal sample value from said third ideal sample value;

a plurality of logic gates configured to calculate a gradient responsive to said first sense of change and said second sense of change; and a plurality of logic devices configured to provide said error value responsive to said gradient and said difference value.

18. The phase detector in accordance with claim 17, in which a plus/minus sign of said difference value is responsive to at least one of said first and said second senses of change.

19. The phase detector in accordance with claim 17, in which said difference between said second ideal sample value and said second actual sample value is used to provide said error value.

20. The phase detector in accordance with claim 17, in which said difference value is provided as said error value when both of said first and said second senses of change are determined to be the same and each non-zero.

* * * * *